United States Patent
Krauch et al.

(10) Patent No.: US 6,668,341 B1
(45) Date of Patent: Dec. 23, 2003

(54) STORAGE CELL WITH INTEGRATED SOFT ERROR DETECTION AND CORRECTION

(75) Inventors: Ulrich Krauch, Dettenhausen (DE); Antje Mueller, Boeblingen (DE); Juergen Pille, Stuttgart (DE); Dieter Wendel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 462 days.

(21) Appl. No.: 09/689,968

(22) Filed: Oct. 12, 2000

(30) Foreign Application Priority Data

Nov. 13, 1999 (EP) .............................................. 99122652

(51) Int. Cl.⁷ ................................................ G06F 11/00
(52) U.S. Cl. ......................... 714/52; 714/758; 365/200
(58) Field of Search ................................. 714/52–54, 6, 714/42, 758, 760, 780, 797, 800; 365/189.03, 189.04, 200, 201, 220

(56) References Cited

U.S. PATENT DOCUMENTS

| | | | |
|---|---|---|---|
| 4,639,865 A | * | 1/1987 | Martin ........................ 712/226 |
| 4,766,573 A | * | 8/1988 | Takemae ..................... 365/222 |
| 5,128,944 A | * | 7/1992 | Flaherty et al. ................. 714/6 |
| 5,623,506 A | * | 4/1997 | Dell et al. ................... 714/766 |
| 5,761,213 A | * | 6/1998 | Adams et al. ............... 714/733 |
| 5,828,383 A | * | 10/1998 | May et al. ................... 345/546 |
| 6,044,487 A | * | 3/2000 | Li ............................... 714/797 |
| 6,349,390 B1 | * | 2/2002 | Dell et al. ....................... 714/6 |
| 6,442,727 B1 | * | 8/2002 | Jones .......................... 714/766 |
| 6,510,537 B1 | * | 1/2003 | Lee ............................. 714/763 |

\* cited by examiner

*Primary Examiner*—Scott Baderman
(74) *Attorney, Agent, or Firm*—Lawrence D. Cutter, Esq.; Kevin P. Radigan, Esq.; Heslin Rothenberg Farley & Mesiti P.C.

(57) ABSTRACT

Storage devices are presented which have some facility of error indication and error correction. The basic idea of the present invention is to double only the storing part inside the storing cell and share the environmental logic. Especially in case of multi-port cells this reduces the area penalty significantly because the read/write control within the cell is shared and only placed once. Writing the cell always writes both latches so that they hold the same data. A soft error can flip only one of the two latches. Then, a 'XOR' block detects that the data is no longer identical. While the data is read out the check bit indicates that the data is corrupted. The approach of doubling only the storing elements can be extended to implement a triple storing element (10, 12, 30) in the same cell. Then, with the help of a small and simple error correction logic (32) in the cell from a 'majority vote' can be seen which bit value is wrong in case of a soft error affecting one bit in the cell. Thus, no post-processing is necessary after reading the bit from the cell, as it is true per se. (FIG. 3).

12 Claims, 2 Drawing Sheets

| cell0 | cell1 | cell2 | corrected data | check bit |
|---|---|---|---|---|
| 0 | 0 | 0 | 0 | 0 |
| 0 | 0 | 1 | 0 | 1 |
| 0 | 1 | 0 | 0 | 1 |
| 0 | 1 | 1 | 1 | 1 |
| 1 | 0 | 0 | 0 | 1 |
| 1 | 0 | 1 | 1 | 1 |
| 1 | 1 | 0 | 1 | 1 |
| 1 | 1 | 1 | 1 | 0 |

STORAGE CELL WITH INTEGRATED SOFT ERROR DETECTION AND CORRECTION

PRIOR FOREIGN APPLICATION

This application claims priority from European Patent Office Application No. 99122652.3, filed Nov. 13, 1999, which is hereby incorporated herein by reference in its entirety.

TECHNICAL FIELD

The present invention relates to electronic and microelectronic devices. In particular, the present invention relates to storage devices and in particular to storage cells, incorporated in computer systems which have some facility of error indication and error correction.

BACKGROUND ART

The present invention has a particular, preferred area in which it can be applied advantageously. This is memories of small capacity, in which control information, i.e. tags is stored for controlling the data flow in a program, or functional storage arrangements as, e.g., multi-port storage cells and content-adressable-memories (CAM).

Alpha particles and cosmic x-rays can disturb data which is stored in the above mentioned storage cells. When a bit value changes due to such occurrences, so-called soft errors have happened. In computer systems in which memory arrangements with an increased level of data security are incorporated, usually some kind of error detection is performed with the help of so called parity bits. In an enhanced form of data security management such soft errors are corrected with the help of so called error correctable codes (ECC). Such prior art technique is efficient only when it is applied portion-wise for large portions of data to be controlled, as e.g., 64 bits, or more. If the bit sequence to be error-controlled is small as it is the case with said tag bits, such ECC-method is not efficient anymore.

A different, second way which is often used for data security in tag bits is to double the data contained in the tag fields and compare it each time the data is read out. See for example in 'Error-correcting Codes for Semiconductor Memory', Chen, C. L., and Hsiao, M. Y., in IBM Journal of Research and Development, vol. 28, No. 2, March 1984. Both ways mentioned above are implementations which imply a data post-processing during which a program run has to be reset and continued with values which are not influenced by the wrong bit value implied by the above mentioned soft error. In modern processors in which a high degree of performance parallelization takes place such post-processing is a complicated and time-consuming work which decreases the overall computing performance.

Said second way to check for data integrity, i.e. to double the data, implies an increased area consumption on the respective chip, as will be described next below.

Error correctable codes add redundant bits, so called parity bits to the actual data bits. I.e. adding 8 ECC bits to a 64 bit word allows to correct a one bit failure and to detect up to two bit failures. An additional amount of 8 of 64 bits means a 12.5% increase in data to be stored and, further, it requires a special, dedicated logic for the generation and decoding of the ECC bits.

In memory devices, as e.g. on processor SRAM caches or main memory DRAM cells the increase of area consumption associated with the additional ECC bits is still tolerable because the area consumption of read and write access units required for accessing the storage cells in large arrays is relatively small compared to the large amount of area required for the data bits which are error-controlled.

For tag bits which are stored usually not in large arrays as e.g. the DRAM memory of a main memory chip but instead, in on processor SRAM arrays, the portion of area required for reading and writing circuits which access the data stored in the storing element of the respective storage cell is remarkably higher. This lies in the fact that only a small number of tag bits is usually stored. Thus, where doubling the tag bits, a 100% overhead plus an additional overhead for the error indication or error correction logic must be tolerated in prior art systems. This problem can be seen in FIG. 1—a schematic illustration of a storage cell implementation—which is drawn only schematically, but which shows clearly the write 14 and read circuitry 16 comprising m+1, and n+1 input, or output lines, respectively with a respective write word line (WWL) or write bit line logic (WBL), or on the reading site—reading logic for word lines or bit lines (RWL, RBL). Such circuitry is required for writing or reading the bit value stored in the storing element 10 of the storage cell As data security of tag bits is per se a must for guaranteeing a strong overall performance in a computer system such large area consumption implied by doubling the tag bits was tolerated in prior art systems. Nevertheless, the post-processing required for correcting the effect of a soft-error in consideration of speculative execution of error-affected code is time-consuming in a parallel processing computer system.

It is thus an object of the present invention to provide a storage cell which can be subjected to error indication methods and error correction methods without such a high overhead in area consumption as they are present in prior art storage cells.

It is a further object of the present invention to provide an improved storage cell which furthermore enhances the foregoing area savings and which is suited to extend this improvement for providing an 'automatic' error correction without any post-processing and without a further remarkable increase in area consumption compared to prior art implementations.

SUMMARY OF THE INVENTION

Said object of the invention is achieved by the features stated in enclosed independent claims. Further advantageous arrangements and embodiments of the invention are set forth in the respective subclaims.

The basic idea of the present invention is to double only the storing part inside the storing cell and share the environmental logic. Especially in case of multi-port cells this reduces the area penalty significantly because the read/write control within the cell is shared and only placed once.

According to a first preferred aspect of the present invention the storing elements in form of feedback latches should be advantageously designed in the layout in a way that a single alpha particle or cosmic x-ray cannot disturb both latch nodes. Writing the cell always writes both latches so that they hold the same data. A soft error can flip only one of the two latches. Then, a 'XOR' block detects that the data is no longer identical. While the data is read out the check bit indicates that the data is corrupted.

As the actual cell latch area is very small compared to the total area the duplication plus the additional 'xor' stage results in only 11% increase in area compared to a cell without duplication. The area advantage significantly increases with the number of ports shared.

According to a further advantageous aspect of the present invention the approach of doubling only the storing elements is extended to implement a triple storing element in the same cell. Then, with the help of a small and simple error correction logic in the cell from a 'majority vote' can be seen which bit value is wrong in case of a soft error affecting one bit in the cell. Thus the coinciding bit value is taken for true. Thus, an automatic bit control is provided in the storing cell itself. This is achieved with minimum expense of logic circuitry and space requirements. The particular advantage is that no post-processing is necessary after reading the bit from the cell, as it is true per se. Further, the advantages seen above are further enhanced.

BRIEF DESCRIPTION OF THE DRAWINGS

The present invention is illustrated by way of example and is not limited by the shape of the Figures of the accompanying drawings in which.

BEST MODE FOR CARRYING OUT THE INVENTION

Figure 1:
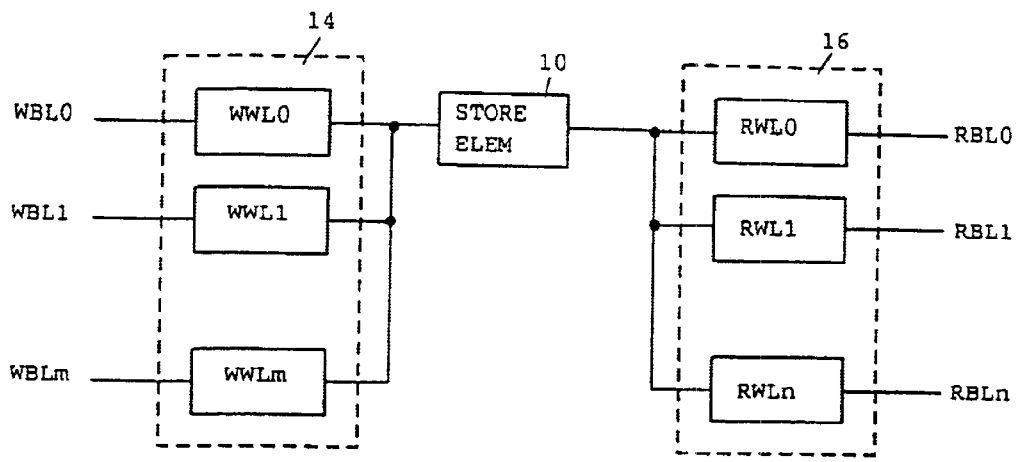
FIG. 1 is a schematic representation of a prior art storage cell including circuitry associated with the read and write access.
Figure 2:
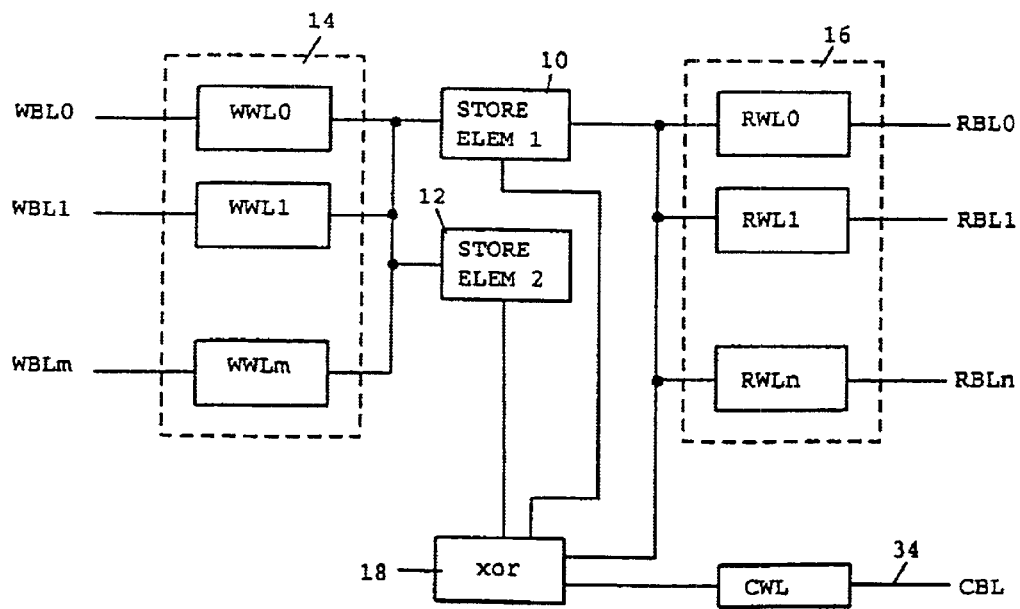
FIG. 2 is a schematic representation of a storage cell according to a first aspect of the present invention.

With general reference to the Figures and with special reference now to FIG. 2 the essential structure of a storage cell according to the present invention is described in more detail.

Two storage elements 10, 12 which are adapted to store each one bit as e.g., prior art storing cell latches, can be accessed by a write circuitry 14 having m+1 lines each connected to both storing elements. Said write circuitry 14 is surrounded by broken lines. When a bit has to be written into the storage cell both storing elements 10, 12 are accessed in order to receive the new value to be stored.

A respective read access circuitry 16—also surrounded by broken lines—is depicted with reference sign 16. In contrast to writing a bit into both storing elements 10, 12, only one storing element, namely e.g. storing element 10 is accessed in a read access. For being sure that no soft error is present an error indication logic 18 is added to the storage cell. This is simply implemented with a xor gate and a respective output line 34—depicted as check word line/check bit line which is able to output a signal indicating when the both values stored in said storing elements 10, 12 are different from each other.

The signal present on said output line is then used for post-processing according to prior art methods.

According to a preferred aspect of the present invention the storing elements 10, 12 are located within the storage cell such that the distance between them is maximum, in order to minimise the probability for an event in which one and the same alpha particle or cosmic x-ray is able to disturb both values at a time.

As the actual cell latch area is very small compared to the total area the inventional latch duplication plus the additional 'XOR' stage results in only 11% increase in area compared to a cell without latch duplication. The area advantage significantly increases with the number of ports shared.

With special reference now to FIG. 3 a storage cell according to a second, preferred aspect of the present invention is described in more detail next below. This is done with the help of a sample embodiment of the inventional storage cell as a multi-port storage cell with an integrated error detection and error correction mechanism.

The structure of the storage cell depicted is similar to that one depicted in FIG. 2. Therefore, the same reference signs refer to the same circuits, or storing elements, again.

Additionally, however, there is implemented a third storing element in the storage cell, which is depicted with reference sign 30. When a bit has to be written into the storage cell the respective value is concurrently written in all three elements 10, 12, 30 via one of the word lines associated with the write access circuit 14. Each of the storing elements 10, 12, 30 has its output connected to a correction logic circuit 32 necessary to evaluate bit coincidence.

Said logic 32 has exemplarily one output line which is connected in parallel to each of the read word/bit lines 0 . . . n and another output line 34 as it was depicted in FIG. 2. The error correction logic circuit 32 is a simple circuit which takes that specific bit value as, an output for the read access circuit which is the 'majority' value of the three values stored in storing elements 10, 12, 30. That means, in a case in which a soft error occurs and one of the three bits stored in the storage cell differs from the two other values the value of the both coinciding storing elements will be selected for output to the read access circuit 16. The logic circuit 32 is thus a simple prior art logic.

Figures 3, 4:
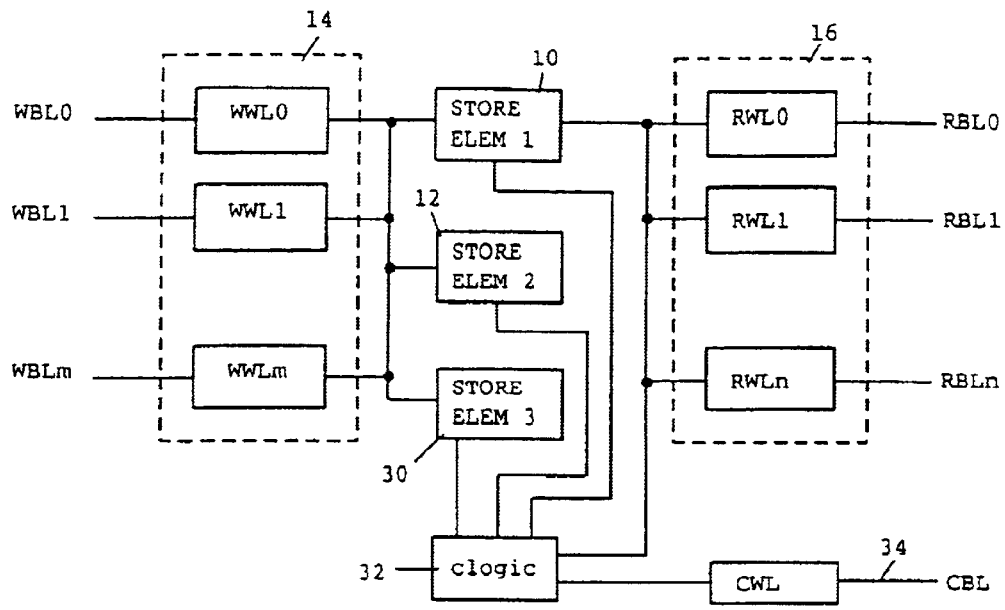
FIG. 3 is a schematic representation according to FIG. 2 and disclosing a storage cell according to a second, preferred aspect of the present invention.
FIG. 4 is a table describing the intended values of the error correction logic contained in the storage cell of FIG. 3.

As reveals from the total storage arrangement depicted in FIG. 3 it is obvious that the wrong bit value in case of a soft error is automatically neglected and the value common to the two other storing elements is taken for output. The probability for an event which disturbs at one time the bit contents of two of the three storing elements depicted in FIG. 3—e.g. caused by an alpha particle is negligible as the storing elements are again located in the storage cell such that the respective distances between them are maximum or—near the maximum.

With reference to FIG. 4 the table is given from which the corrected data and the signal present on the check bit line 34 can be seen dependent of the various input combinations of the three storing elements 10, 12, 30.

For example the most common cases are depicted in the upper most and the bottom most line of the table. Here, the bit values of all three storing elements coincide. Thus, the corrected data coincides with the three values and the check bit is defined as Zero as there was no error correction required. In all other cases an error correction is required. Thus, in the right most check bit column there is always depicted a One. In these cases, in which a soft error occurs all combinations which can happen are depicted in the table. The corrected data is always the value which two of three storing elements have in common. The differing single value is never taken as corrected data output. The check bit feature is functionally not nedded but optional for system error tracking.

It should be understood that storage cells as they are claimed in the appended claims can be incorporated into any larger-scale memory device which can in turn be embedded into other circuits, or, which represent individual, independent memory chips. The most important advantage associated with the storage cell as it is depicted only exemplarily in FIG. 3 is that no post-processing in order to reset the computer into the non-disturbed status as it is required in prior art needs to take place. The additional area required for the error correction logic 32 is remarkably small compared to prior art circuits with the same guaranty for correct data output. The other remarkable advantage that no post-processing is required yields to an overall performance increase, in particular, in the case when tag bits are stored the security of which is very sensible for program performance.

A further advantageous aspect of the present invention is that the additional time required for passing the error correction logic 32 in FIG. 3 is quiet small compared to the read process in a multi-port storage cell. As said additional time can be added to the short time required for writing into the three storing elements the read performance of the inventional storage cell is not decreased.

A further advantageous aspect of the present invention is that all transistors used for constructing the additional error correction logic are connectable such that the inventional storage cell circuitry can be tested with state of the art methods as it is for example the LSSD-method (Level-Sensitive-Scan-Design).

Although preferred embodiments have been depicted and described in detail herein, it will be apparent to those skilled in the relevant art that various, modifications, additions, substitutions and the like can be made without departing from the spirit of the invention and these are therefore considered to be within the scope of the invention as defined in the following claims.

What is claimed is:

1. Storage cell comprising a first bit storing element (10), a bit read access circuit (16) and a bit write access circuit (14) having at least one port, characterized in that storage cell comprises a second bit storing element (12) which is accessible through the same access circuits (14, 16) provided for accessing the first bit storing element (10), said storage cell further comprising an error indication logic (18) with an associated output line, said error indication logic (18) being responsive to inequality of values stored in said first bit storing element (10) and said second bit storing element (12), wherein said first bit storing element (10) and said second bit storing element (12) are arranged to minimize the probability that a single alpha particle or cosmic x-ray changes both of said values.

2. Storage cell according to claim 1, in which the error indication logic (18) comprises an XOR-stage.

3. Storage cell according to claim 2, in which the locations of the bit storing elements are arranged within the storage cell such that the distance between them is maximum to facilitate minimizing the probability that a single alpha particle or cosmic x-ray changes both of the values stored in the first bit storing element (10) and the second bit storing element (12).

4. Storage cell according to claim 3, in which transistors building up the storage cell are arranged in a parallel form.

5. Storage cell according to claim 1, further comprising a third storing element (30) which is accessible through the same access circuits (14, 16) provided for accessing the first (10) and the second bit storing elements (12).

6. Storage cell according to claim 5, further comprising an error correction logic (32) arranged for outputting a majority value which is common to that ones stored in two of said three bit storing elements (10, 12, 30) when one bit value differs from the other two values.

7. Storage cell according to claim 6 in which the locations of the bit storing elements are arranged within the storage cell such that the distance between them is maximum to facilitate minimizing the probability that a single alpha particle or cosmic x-ray changes both of the values stored in the first bit storing element (10) and the second bit storing element (12).

8. Storage cell according to claim 7, in which transistors building up the storage cell are arranged in a parallel form.

9. A sub-unit for use in microprocessor devices having at least one array of storage cells according to claim 1.

10. A microprocessor device having at least one sub-unit according to claim 9.

11. A computer system having a microprocessor device according to claim 10.

12. A storage cell according to claim 1 for storing tag bits associated with the control of program data flow.

* * * * *

UNITED STATES PATENT AND TRADEMARK OFFICE
CERTIFICATE OF CORRECTION

PATENT NO. : 6,668,341 B1
DATED : December 23, 2004
INVENTOR(S) : Krauch et al.

It is certified that error appears in the above-identified patent and that said Letters Patent is hereby corrected as shown below:

<u>Column 4,</u>
Line 57, delete the word "nedded" and insert the word -- needed --

<u>Column 5,</u>
Line 9, delete the word "quiet" and insert the word -- quite --

Signed and Sealed this

Sixteenth Day of March, 2004

JON W. DUDAS
*Acting Director of the United States Patent and Trademark Office*